United States Patent
Karve et al.

(10) Patent No.: US 9,362,280 B2
(45) Date of Patent: Jun. 7, 2016

(54) SEMICONDUCTOR DEVICES WITH DIFFERENT DIELECTRIC THICKNESSES

(71) Applicants: Gauri V. Karve, Austin, TX (US); Mark D. Hall, Austin, TX (US); Srikanth B. Samavedam, Austin, TX (US)

(72) Inventors: Gauri V. Karve, Austin, TX (US); Mark D. Hall, Austin, TX (US); Srikanth B. Samavedam, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 389 days.

(21) Appl. No.: 13/893,026

(22) Filed: May 13, 2013

(65) Prior Publication Data

US 2013/0249015 A1 Sep. 26, 2013

Related U.S. Application Data

(62) Division of application No. 11/931,565, filed on Oct. 31, 2007, now Pat. No. 8,460,996.

(51) Int. Cl.
*H01L 21/70* (2006.01)
*H01L 27/092* (2006.01)
*H01L 21/8238* (2006.01)
*H01L 29/10* (2006.01)

(52) U.S. Cl.
CPC ...... *H01L 27/092* (2013.01); *H01L 21/823807* (2013.01); *H01L 21/823857* (2013.01); *H01L 29/1054* (2013.01)

(58) Field of Classification Search
CPC ............... H01L 21/823807; H01L 21/823857; H01L 27/092; H01L 29/1054
See application file for complete search history.

(56) References Cited

U.S. PATENT DOCUMENTS

| | | | |
|---|---|---|---|
| 6,787,421 B2 | 9/2004 | Gilmer et al. | |
| 2002/0125497 A1* | 9/2002 | Fitzgerald | H01L 21/02381 257/191 |
| 2004/0032001 A1 | 2/2004 | Gilmer et al. | |
| 2005/0088889 A1* | 4/2005 | Lee | H01L 27/105 365/202 |
| 2005/0274978 A1 | 12/2005 | Antoniadis et al. | |
| 2006/0157732 A1 | 7/2006 | Von Kaenel et al. | |
| 2006/0284164 A1 | 12/2006 | Lee et al. | |
| 2006/0292776 A1 | 12/2006 | Jin et al. | |
| 2007/0052036 A1 | 3/2007 | Luan et al. | |

FOREIGN PATENT DOCUMENTS

| TW | 561579 B | 11/2003 |
|---|---|---|
| TW | 200414529 | 8/2004 |
| TW | 200711046 | 3/2007 |

OTHER PUBLICATIONS

Iyer et al., "A Gate-Quality Dielectric System for SiGe Metal-Oxide-Semiconductor Devices", IEEE Electron Device Letters, vol. 12, No. 5, May 1991.

* cited by examiner

*Primary Examiner* — Meiya Li
(74) *Attorney, Agent, or Firm* — David G. Dolezal

(57) ABSTRACT

An integrated circuit with devices having dielectric layers with different thicknesses. The dielectric layers include a high-k dielectric and some of the dielectric layers include an oxide layer that is formed from an oxidation process. Each device includes a layer including germanium or carbon located underneath the electrode stack of the device. A silicon cap layers is located over the layer including germanium or carbon.

19 Claims, 4 Drawing Sheets

SEMICONDUCTOR DEVICES WITH DIFFERENT DIELECTRIC THICKNESSES

This application is a divisional application of a US patent application entitled "Semiconductor Devices with Different Dielectric Thicknesses," having a serial number of Ser. No. 11/931,565, having a filing date of Oct. 31, 2007, having common inventors, and having a common assignee, all of which is incorporated by reference in its entirety.

BACKGROUND OF THE INVENTION

1. Field of the Invention

This invention relates in general to semiconductor devices and more specifically to semiconductor devices with different dielectric thicknesses.

2. Description of the Related Art

Some integrated circuits may include semiconductor devices with different dielectric thickness e.g. different gate dielectric thicknesses. For example, some integrated circuits may have high speed circuits operating in a lower voltage domain and input/output (I/O) circuitry operating at a higher voltage domain. The higher voltage domain requires transistors with thicker gate dielectrics than transistors of the lower voltage domain.

Implementing an integrated circuit with devices of different dielectric thicknesses may be challenging e.g. especially for devices with silicon germanium channels, high dielectric constant (high-k) gate dielectrics, and/or metal gates.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
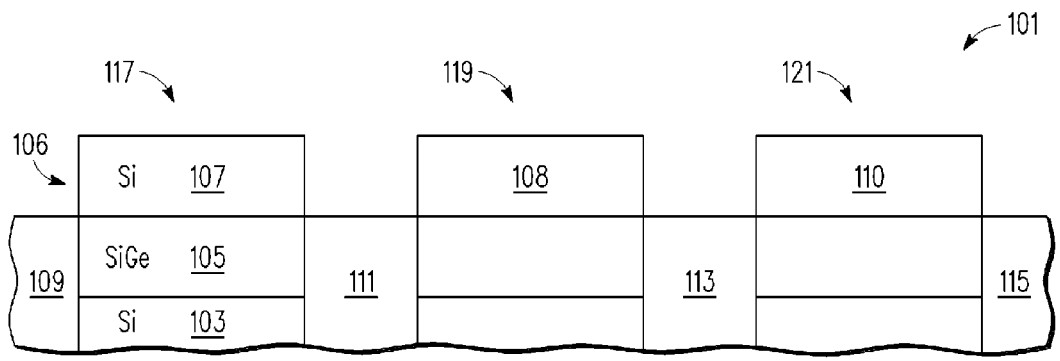
FIGS. 1-9 show side cut away views of various stages in the manufacture of a wafer according to one embodiment of the present invention.

FIG. 1 is a cutaway side view of wafer 101 used to make semiconductor devices having different dielectric thicknesses in different regions. Shown in FIG. 1 are regions 117, 119, and 121 of wafer 101 in which semiconductor devices of different dielectric thicknesses will be formed. Wafer 101 includes a silicon layer 103 which in one embodiment, is monocrystalline silicon. Layer 103 may be a bulk silicon layer or located on an insulator layer such as e.g. with a semiconductor on insulator (SOI) configuration. In the embodiment shown, a layer 105 of monocrystalline silicon germanium is formed on layer 103. In one embodiment, layer 105 is formed by selective epitaxial growth, but may be formed by other processes (e.g. chemical vapor deposition (CVD), physical vapor deposition (PVD)) in other embodiments. In some embodiments, well ion implantation in layer 103 for setting a threshold voltage is performed prior to the formation of layer 105.

In one embodiment, layer 105 is strained for carrier mobility enhancement. For example, layer 105 is under a compressive strain for enhancement of hole mobility in P-channel devices. This strain is induced by the inclusion of a strain enhancing impurity of germanium which provides the layer with a different natural lattice constant (the lattice constant of the layer if in a relaxed state) than the actual lattice constant in at least one direction. In other embodiments, layer 105 may include carbon. In one embodiment, layer 105 would not be under a strain. In some embodiments, layer 105 has a thickness in the range of 10-100 Angstroms, and in one embodiment has a thickness of 40 Angstroms. Layer 105 may be of other thicknesses in other embodiments. In one embodiment, the germanium concentration is in the range of 10-50%, but may be of other concentrations in other embodiments. In one embodiment, layer 105 may contain boron for threshold voltage adjustment.

The presence of germanium (boron or carbon in some embodiments) in layer 105 may present challenges in subsequent thermal cycles, especially where the diffusion of the germanium is undesired.

Wafer 101 includes isolation trenches 109, 111, 113, and 115 located between regions 117, 119, and 121. In one embodiment, these trenches are formed subsequent to the formation of layer 105. In some embodiments, these trenches have a depth in the range of 2000-5000 Angstroms for a bulk silicon wafer. In other embodiments, the trenches would extend to the underlying insulator layer for an SOI wafer.

In another embodiment, the silicon germanium layer (105) would be epitaxially grown after the formation of trenches 109, 111, 113, and 115 so that the high temperature processes for insulator trench formation will not cause the germanium in layer 105 to diffuse into layer 103.

A silicon layer 106 including portions 107, 108, 110 is formed in each region 117, 119, and 121, respectively, on top of layer 105. In one embodiment, layer 106 is formed by epitaxial growth. Portions 107, 108, and 110 will be used to for growing a high quality dielectric layer, and in some regions, will provide a channel region that maximizes carrier mobility at the interface of the gate dielectric. In some embodiments, layer 106 has a thickness in the range of 10-100 angstroms and are preferably 40 Angstroms in one embodiment, but may be of other thicknesses in other embodiments. In some embodiments, layer 106 has substantially no carbon or germanium (0-5% germanium or 0-2% carbon). In some embodiments, layer 106 has the same level of boron as layer 105.

In some embodiments, layer 106 may be strained. In some embodiments, layer 105 would not be under a strain, and the lattice constant of layer 106 would be tensilely strained due to the silicon having a smaller natural lattice constant than silicon germanium.

In other embodiments, trenches 109, 111, 113, and 115 may be formed after the formation of layer 106 where layer 106 would be initially formed as one continuous layer.

In one embodiment, layers 103, 105, and/or 106 may have well doping (either in-situ or implanted) of impurities (arsenic, antimony, phosphorus, indium, or boron).

The ratio of the thickness of layer 106 to the widths of regions 117, 119, and 121 may be different than that shown in FIG. 1. For example, the widths of regions 117, 119, and 121 may be significantly greater such that multiple devices may be formed therein. Furthermore, the isolation trenches may be wider than that shown in FIG. 1. However, the widths and thicknesses shown in FIG. 1 and the other Figures are for the ease of illustrating the processes used in forming structures in the different regions.

Figure 2:
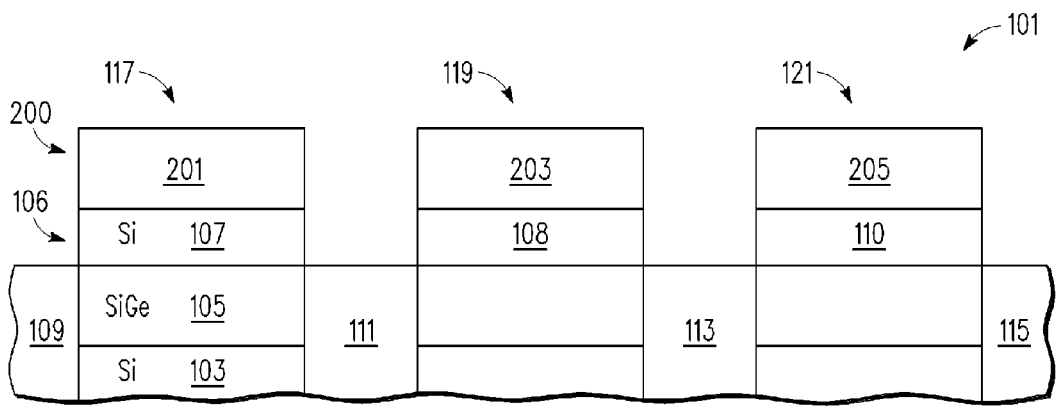

FIG. 2 shows wafer 101 after oxide layer 200 is thermally grown on layer 106, respectively. In some embodiments, layer 200 has a thickness in the range of 10-100 angstroms and is preferably 40 Angstroms in one embodiment. However, layer 200 may have other thicknesses in other embodiments. Layer 200 includes portions 201, 203, and 205 grown on portions 107, 108, and 110, respectively.

In some embodiments, layer 200 is grown using a "low" temperature oxidation process to minimize germanium out diffusion into layer 106 and 103. In one embodiment, an in-situ steam generation process is used to grow layer 200. In one embodiment, the in-situ steam generation process is performed in a single wafer chamber, but could be performed in other equipment in other embodiments. In another embodiment, a plasma nitridation process may be used for form layer 200. In one embodiment, the low temperature oxidation process is performed at a temperature of 950 degrees C. or less and preferably at temperatures around 850 degrees C. Performing the oxidation process at 950 degrees C. or less minimizes the germanium diffusion while forming a high quality and reliable oxide. In one embodiment, the oxidation process is performed at a temperature of at least 750 degrees to ensure that an oxide of a particular quality and reliability is formed. In some embodiments, a higher quality dielectric used as a gate dielectric may provide for a higher voltage breakdown and for a reduced amount of gate leakage current. In some embodiments after the formation of layer 200, additional anneal processes may be utilized to improve oxide quality.

In one embodiment, the oxidation process has a "time at temperature" in a range of less than 30 minutes, and preferably less than 5 minutes to minimize germanium out diffusion. However, other processes may have other cycle times.

In one embodiment, layer 200 has a thickness in the range of 10-100 angstroms, but may have other thicknesses in other embodiments. In one embodiment, the thickness of layer 200 is governed by the highest operating voltage in which any devices of an integrated circuit will operate.

The oxidation process consumes a portion of the thickness of layer 106. In some embodiments, the amount of thickness reduction of layer 106 is in the range of 5-70 angstroms and is preferably reduced by approximately 16 Angstroms in one embodiment. However, the reduction in thickness may be in other ranges in other embodiments. The amount of silicon consumed by the oxidation is less than the thickness of layer 106 in order to ensure that portions of layer 106 in regions 117, 119, and 121 remain after the oxidation for use in devices formed therein.

Figure 3:
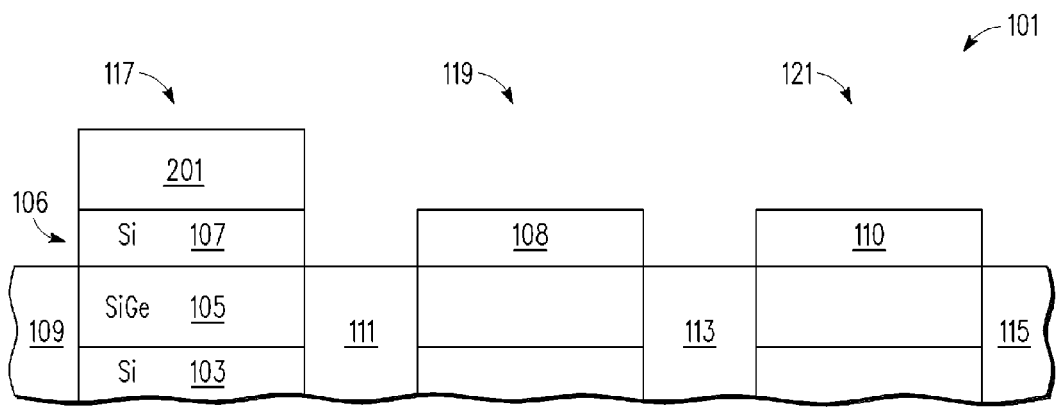

FIG. 3 shows wafer 101 after oxide portions 203 and 205 of layer 200 have been removed from wafer 101. In one embodiment, these portions may be removed by selectively forming a mask (e.g. photo resist) over region 117 while exposing regions 119 and 121. Wafer 101 is then subjected to an etch (e.g. a wet etch of HF acid) to remove the oxide of portions 203 and 205. Other processes for removal may be used in other embodiments.

Figure 4:
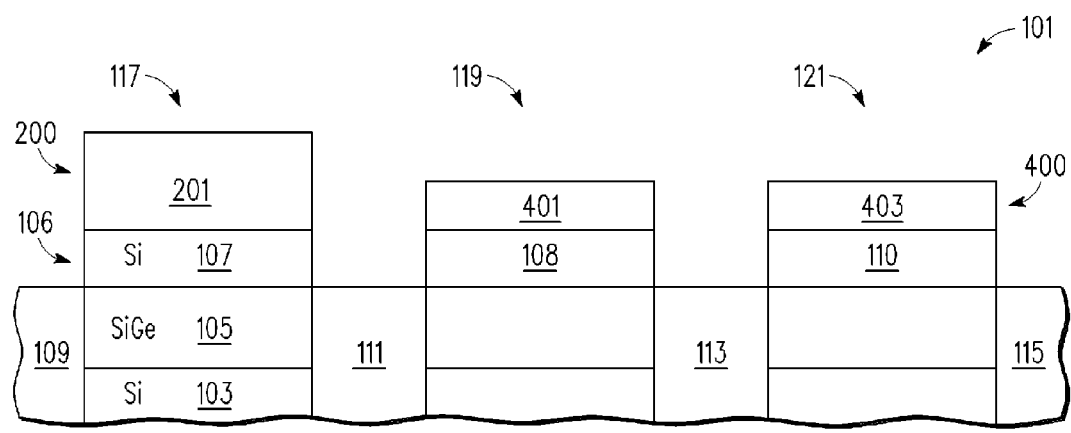

FIG. 4 shows wafer 101 after it has been subjected to a second oxidation process where portions 401 and 403 of oxide layer 400 are grown from portions 108 and 110, respectively. In some embodiments, the thickness of portion 201 is further increased by this second oxidation process.

In one embodiment, the oxidation process for forming layer 400 is performed within the same temperature ranges as that given above for forming layer 200. In one embodiment, the cycle times of this oxidation process may be the same or different from the cycle times given above for forming layer 200 depending upon the desired thickness of layer 400. Germanium diffusion of layer 105 may be minimized where process temperatures of this second oxidation process are less than 950 degrees C.

In some embodiments, layer 400 may have a thickness in the range of 10-100 Angstroms and is preferably 25-30 Angstroms thick in one embodiment. However, in other embodiments, layer 400 has other thickness. In one embodiment, portion 201 may be increased in thickness by a range of 0-20 Angstroms by the second oxidation process, but may be increased by other amounts in other embodiments.

In the second oxidation process, upper portions of portions 107, 108, and 110 are consumed. In some embodiments, the thickness of portions 108 and 110 is reduced by an amount in the range of 5-50 Angstroms and is preferably by 10-12 Angstroms in one embodiment. However, these portions may be reduced by other amounts in other embodiments. The thickness of portion 107 may be reduced by a lesser amount due to it being covered by portion 201 during oxidation. In one embodiment, approximately 8-12 Angstroms of portions 108 and 110 are left after the second oxidation.

Figure 5:
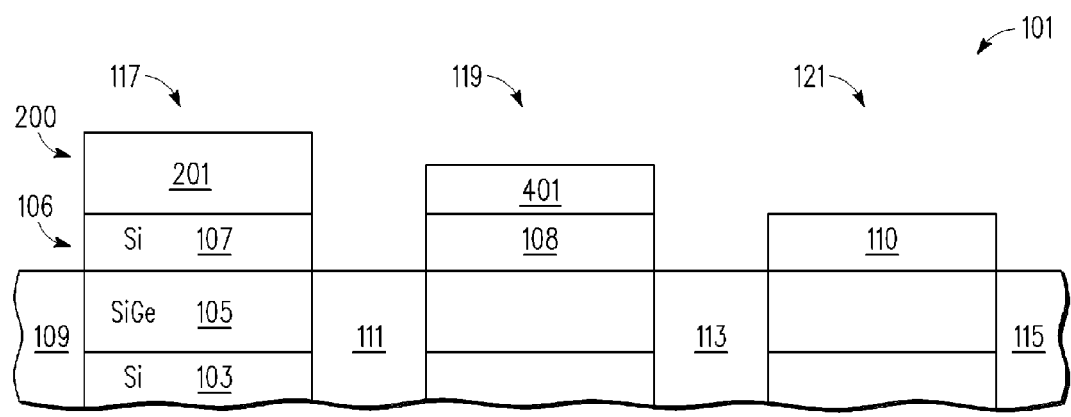

FIG. 5 shows wafer 101 after portion 403 has been removed from region 121. In one embodiment, portion 403 may be removed by masking regions 117 and 119 and subjecting wafer 101 to a wet etch. In a preferred embodiment, by controlling the thickness of layer 106 and oxidation time for the first and second oxidations, a layer of approximately 8-10 Angstroms of silicon remains after the first and second oxidations. This silicon layer improves the interface state density at the high-k dielectric interface thus increasing hole mobility for p-channel devices.

After the stage shown in FIG. 5, wafer 101 may be subject to a cleaning process. In one embodiment, wafer 101 may be subject to a wet solution clean of hydrochloric acid, hydrogen peroxide, and water. In other embodiments, other cleaning processes may be used to establish desired interface properties. Other cleaning processes may be performed at other stages as well. For example, cleaning processes may be performed prior to each of the oxidation processes described above.

In one embodiment, the first and second oxidation processes may be performed with different precursors to provide oxide with different desired properties. For example, the oxidation process to form layer 200 may be performed with less nitrogen than in the oxidation process used to form layer 400.

Figure 6:
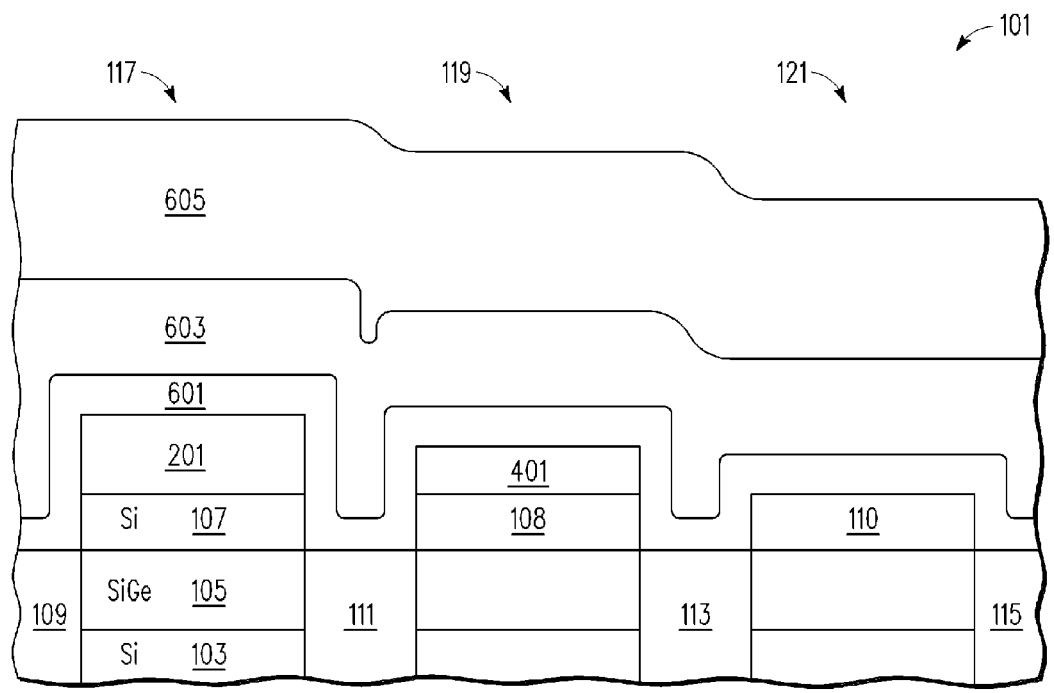

FIG. 6 shows wafer 101 after a high-k dielectric layer 601, metal layer 603, and a layer 605 of polysilicon are deposited over wafer 101. In one embodiment, each of these layers is conformal.

In some embodiments, high-k dielectric layer 601 may include hafnium, lanthanum, aluminum, silicon, zirconium, or other metals. For example, layer 601 may include hafnium oxide, hafnium silicate, hafnium aluminate, zirconium oxide, zirconium silicate, hafnium zirconate, or other suitable high-k materials. In one embodiment, layer 601 may include a capping layer of a metal or metal oxide such as lanthanum, magnesium, lanthanum oxide, magnesium oxide, aluminum, or aluminum oxide. In one embodiment, this capping layer has a thickness in the range of 1-10 Angstroms.

In some embodiment, layer 601 has a thickness in the range of 5-50 Angstroms and is preferably 20 Angstroms in one embodiment. However, layer 601 may have other thicknesses in other embodiments. A high-k dielectric is a material with a dielectric constant of 7.0 or greater. Utilizing a high-k dielectric provides devices formed in region 121 with a higher capacitance for better channel control.

In one embodiment, layer 601 is formed by an initial thin silicon oxide growth of 3-15 Angstroms on portion 110 followed by a deposition of a metal containing dielectric layer. In one embodiment, this thin silicon oxide layer is grown chemically. In one embodiment, this deposition may be performed by a chemical vapor deposition (CVD) process. Layer 603 may be formed by other methods in other embodiments.

In one embodiment, metal layer 603 may be made of tantalum carbide, titanium nitride, titanium aluminum nitride, titanium magnesium carbide, tantalum nitride, or other material. In some embodiments, layer 603 has a thickness in the range of 20-200 Angstroms, and is preferably 100 Angstroms in one embodiment. Layer 603 may have other thicknesses in other embodiments. Metal layer 603 may eliminate poly depletion for transistors having gates (control electrodes for field effect transistors (FETs)) built with layer 603. This may provide for increased gate coupling to the channel. In one embodiment layer 603 is formed by a CVD process, but may be formed by other processes such as e.g. by sputtering or atomic layer deposition.

Polysilcon layer 605 is formed by sputtering, a plasma CVD process, or by other process. In some embodiments, layer 605 has a thickness in the range of 200-1000 Angstroms, but may have other thicknesses in other embodiments.

Following the stage shown in FIG. 6, layers 605, 603, 601, 200, and 400 are patterned to formed various semiconductor devices in regions 117, 119, and 121. For example, these regions may be patterned to form electrode stacks (e.g. a control electrode stack, a capacitive electrode stack) for devices (e.g. transistors, diodes, capacitors) formed in these regions.

Figure 7:
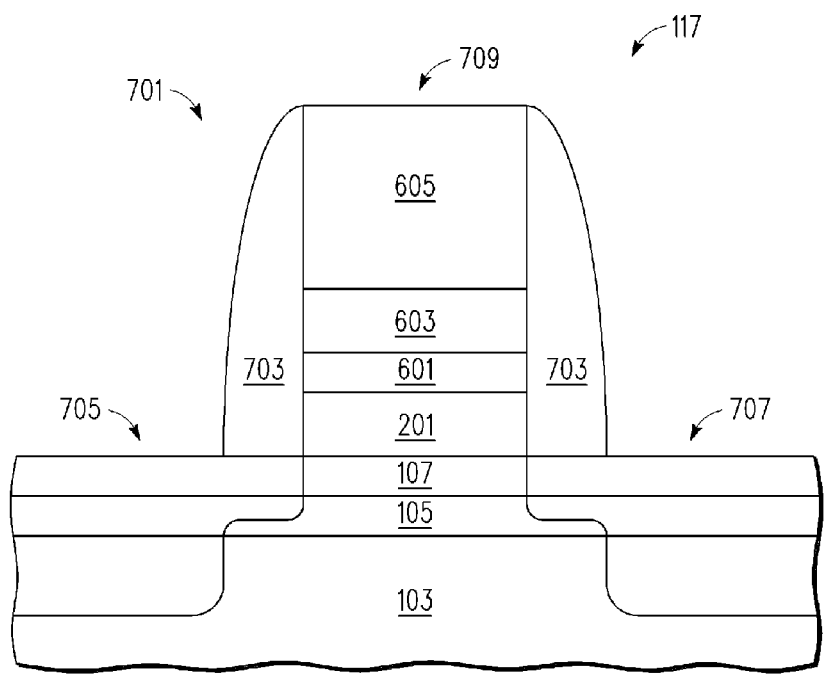

FIG. 7 is a partial side cutaway view of a transistor formed in region 117 of wafer 101. In the embodiment shown, transistor 701 includes a gate stack 709 formed by patterning layers 605, 603, and 601 and portion 201. In the embodiment shown, after patterning, current electrode dopants (e.g. boron, phosphorus, antimony, arsenic) are implanted into current electrode regions 705 and 707 for forming extension regions of the current electrode regions. An additional spacer may be formed prior to the dopant implantation. The type of dopant implanted depends upon transistor polarity. For example, a dopant such as boron or boron fluoride is used for P-type transistors, and a dopant such as arsenic or phosphorous is used for N-type transistors. Additionally, an opposite type dopant such as arsenic or phosphorous for P-type transistors and boron or boron fluoride for N-type transistors may be implanted at this step as a halo implant for short channel length device performance optimization. Afterwards, spacer 703 is formed and a second implantation of current electrode dopants is implanted (at a higher energy) into areas of regions 705 and 707 uncovered by spacer 703 for forming the deeper junctions of regions 705 and 707. In the embodiment shown, current electrode dopants are implanted into layers 103 and 105 and portion 107. The type of dopant implanted depends upon transistor polarity (e.g. boron or boron fluoride for P-type transistors and arsenic or phosphorous for N-type transistors). However, a transistor may be formed by other processes, may be of other materials, and may have other configurations in other embodiments.

In the embodiment shown, layer 601 and portion 201 serve as the gate dielectric (a control electrode dielectric for a FET) for transistor 701. In one embodiment, portion 201 may be in the range of 15 to 150 Angstroms and layer 601 may be in the range of 5-50 Angstroms. However, these layers may be of other thicknesses in other embodiments. The thicknesses and composition of portion 201 and layer 601 provide a transistor with a gate dielectric that is sufficient to operate in the voltage range of the devices in region 117.

In one embodiment, transistor 701 is a P-channel field effect transistor. However, N-channel transistors in region 117 may also have a gate stack similar to gate stack 709.

Figure 8:
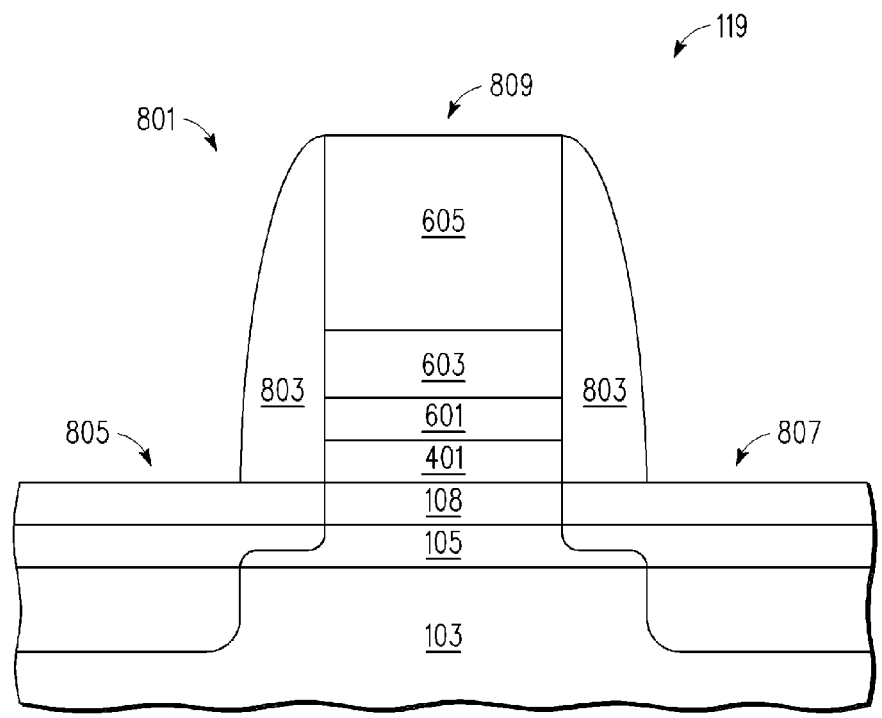

FIG. 8 is a partial side view of a transistor formed in region 119 of wafer 101. In the embodiment shown, transistor 801 includes a gate stack 809 formed by patterning layers 605, 603, and 601 and portion 401. In the embodiment shown, after patterning, current electrode dopants (e.g. boron, phosphorus, antimony, arsenic) are implanted into current electrode regions 805 and 807 for forming extension regions of the current electrode regions. The type of dopant implanted depends upon the transistor polarity. An additional spacer (not shown) may be formed prior to dopant implantation. Also, halo implants for short channel length device optimization may be performed as well. Afterwards spacer 803 is formed and a second implantation of current electrode dopants is implanted (at a higher energy) into areas of regions 805 and 807 uncovered by spacer 803 for forming the deeper junctions of regions 805 and 807. The type of dopants implanted depends upon transistor polarity. In the embodiment shown, current electrode dopants are implanted into layers 103 and 105 and portion 107. However, a transistor may be formed by other processes, may be of other materials, and may have other configurations in other embodiments.

In the embodiment shown, layer 601 and portion 401 serve as the gate dielectric for transistor 801. In one embodiment, portion 401 may be in the range of 10-100 Angstroms and layer 601 may be in the range of 5-50 Angstroms. However, these layers and portions may be of other thicknesses in other embodiments. The thickness and composition of portion 401 and layer 601 provide transistor 801 with a gate dielectric that is sufficient to operate in the voltage range of the devices in region 119.

In the embodiment shown, the gate dielectric for transistor 801 has a different thickness (a smaller thickness) than the thickness of the gate dielectric (layer 601 and portion 201) for transistor 701. Accordingly, the processes described herein may advantageously be used to provide transistors of the same conductivity type having SiGe channel regions with different thicknesses of gate dielectrics with at least some of the gate dielectric layers formed from thermal oxidation processes resulting in better quality and more reliable gate dielectrics. With the processes described above, these different dielectric layers can be formed from separate thermal oxidation processes while inhibiting germanium diffusion from those processes.

In one embodiment, transistor 801 is a P-channel field effect transistor. However, N-channel transistors in region 119 may also have a gate stack similar to gate stack 809.

Other types of semiconductor devices may be made in regions 117 and 119. For example a capacitor may be made in either of these regions where layers 605 and 603 serve as an electrode of the capacitor. In such embodiments, the widths of these layers may be greater that the widths of a transistor gate. In the embodiment of FIG. 8, layer 601 and portion 401 would serve as the dielectric of the capacitor wherein portions of portion 108 and layers 105 and 103 would serve as the other capacitor electrode. Other types of semiconductor devices (e.g. gated diodes capacitors, and resistors) that may be formed in these regions.

Figure 9:
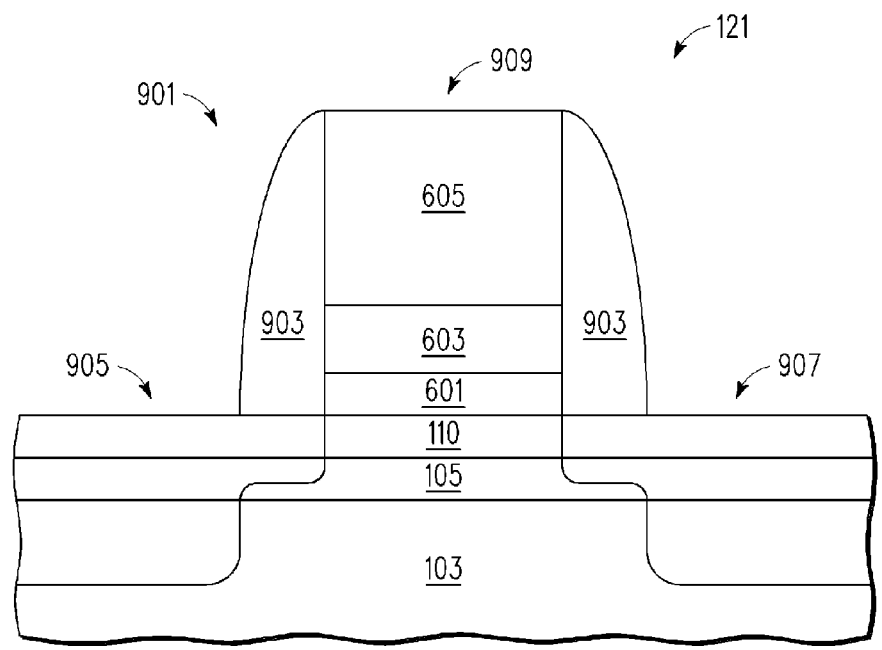

FIG. 9 is a partial side view of a transistor formed in region 121 of wafer 101. In the embodiment shown, transistor 901 includes a gate stack 909 formed by patterning layers 605, 603, and 601. In the embodiment shown, after patterning, current electrode dopants (e.g. boron, phosphorus, antimony, arsenic) are implanted into current electrode regions 905 and 907 for forming extension regions of the current electrode regions. The type of dopants implanted would depend on device polarity. In some embodiments, an additional spacer may be formed prior to dopant implantation. In some embodiments, a halo implant for short channel length device performance optimization may be performed. Afterwards, spacer 903 is formed and a second implantation of current electrode dopants is implanted (at a higher energy) into areas of regions 905 and 907 uncovered by spacer 903 for forming the deeper junctions of regions 905 and 907. The type of dopant implanted depends on device polarity. In the embodiment shown, current electrode dopants are implanted into layers 103 and 105 and portion 107. However, a transistor may be formed by other processes, may be of other materials, and may have other configurations in other embodiments.

In the embodiment shown, layer 601 serves as the gate dielectric for transistor 701. Providing transistor 901 with a high-k gate dielectric may provide transistor 901 with a higher capacitance for better channel control. Accordingly, transistor 901 may operate with more drive current and less leakage current than the transistors of regions 117 and 119. Other types of semiconductor devices may be formed in region 121.

In the embodiment shown, the thicknesses of portions 107, 108, and 110 are sized such that at least some of portion 110 remains after the two oxidation processes and any cleaning processes. In one embodiment, it is desirable for portion 110 to be of at least 8-10 Angstroms thick after the stage shown in FIG. 9 (after the second oxidation). However, other minimum thicknesses may be desired in other embodiments. In one embodiment, portion 110 has a thickness of less than 30 Angstroms. In the embodiment of FIG. 7, the resulting cap portion 107 would be thicker (e.g. by 15-25 Angstroms in one embodiment) than cap portion 110 in embodiments where transistors 701 and 901 are P-channel devices.

In one embodiment, the transistors formed in region 121 may be utilized to form high speed logic, SRAM cells, control logic, or processor cores. These circuits typically operate in lower voltage domains of an integrated circuit and operate at higher speeds. The transistors of region 117 would typically operate at higher voltages on an integrated circuit. For example, the transistors of region 117 may be used for I/O circuitry and decoupling capacitors. The transistors of region 119 may be utilized to form transistors and capacitors of an intermediate voltage domain. For example, transistors in region 119 may be used to support lower voltage I/O circuitry, or in circuits where standby power consumption needs to be lower. The intermediate region may also be used for circuitry where there is balanced need for speed and power consumption requirements. The devices in the intermediate region may also be used for decoupling capacitors.

After the stages set forth in FIGS. 7, 8, and 9, further processes may be performed on wafer 101 including forming silicides, interconnects, interlayer dielectrics, and external connectors (e.g. bond pads). Afterwards, wafer 101 is singulated (e.g. with a wafer saw) into individual integrated circuits where each integrated circuit includes a region 117, a region 119, and a region 121. Each of these regions of an integrated circuit may have multiple N-channel transistors and P-channel transistors.

In one embodiment, transistors 701, 801, and 901 are all of the same conductivity type (e.g. P-channel type or N-channel type for a field effect transistor). In other embodiments, the transistors may be of different conductivity types. In one embodiment, each region may have multiple transistors of each conductivity type.

Although the above description describes two oxidation processes (e.g. an oxidation process that forms layer 200 and an oxidation process that forms layer 400), other embodiments may include a different number of oxidation processes. For example, one embodiment may only include one oxidation process where only two regions of different gate dielectric thicknesses are formed. Other embodiments may include 3 or more oxidation processes where a different dielectric thickness is formed for each process. In some embodiments, the starting thickness of layer 106 is based on the number oxidation processes that the layer is subject to such that the thickness of portion 110 in transistor 901 is at least 8-10 angstroms.

What has been described herein are processes that may allow for the formation of semiconductor devices in an integrated circuit with different electrode dielectric thicknesses where some of the electrode dielectric thicknesses are formed at least partially from a thermal oxidation process and others are formed of a high-k dielectric material. This may provide for an integrated circuit that includes both devices for high speed circuitry (e.g. processors, high speed logic) and devices operating at a higher voltage (e.g. I/O circuitry). Furthermore, these processes are conducive to the formation of semiconductor devices that include germanium (or carbon) such that the germanium (or carbon) does not diffuse excessively during the control electrode dielectric oxidation processes. Preventing excessive movement of germanium during the electrode dielectric oxidation process helps maximize device performance especially for devices where strain enhancing impurities (e.g. germanium, carbon) are used, either in the strained layer or to form the strained layer. Also, these processes may also be used to prevent diffusion of other doped impurities (e.g. Boron).

In one embodiment, a method includes providing a first layer. The first layer includes at least one of a group consisting of germanium and carbon. The method includes providing a second layer comprising silicon and substantially no germanium or carbon. The second layer overlies the first layer. The method also includes oxidizing at least an upper portion of the second layer to form a first oxidized layer. The method also includes removing the first oxidized layer in a first region and retaining the first oxidized layer in a second region. The method further includes after said step of removing, forming a high-k dielectric layer in the first region and in the second region. The method further includes forming a first semiconductor device in the first region and forming a second semiconductor device in the second region.

In another embodiment, a method includes forming a first layer. The first layer including at least one of a group consisting of germanium and carbon. The method also includes forming a second layer comprising silicon and substantially no carbon or germanium, wherein the second layer overlies the first layer. The method also includes oxidizing at least a portion of the second layer to form an oxidized layer, removing the oxidized layer in a first region and retaining the oxidized layer in a second region, and after said step of removing, forming a high-k dielectric layer in the first region and in the second region. The high-k dielectric layer has a dielectric constant greater than or equal to 7.0. The method also includes forming a metal layer over the first region and the second region and completing formation of a first transistor in the first region. The first transistor has a first control electrode dielectric including a portion of the high-k dielectric layer and does not include a portion of the oxidized layer. The first transistor includes a control electrode including a first portion of the metal layer, wherein the first transistor is of a first conductivity type. The method further including completing formation of a second transistor in the second region. The second transistor has a second control electrode dielectric comprising a portion of the high-k dielectric layer and a portion of the oxidized layer. The second transistor includes a control electrode including a second portion of the metal layer. The second transistor is of the first conductivity type.

In one embodiment, an integrated circuit includes a first semiconductor device having a first active region underlying a first electrode stack. The first active region includes a first layer including at least one of a group consisting of germanium and carbon and a first cap layer overlying the first layer. The first cap layer including silicon and substantially no carbon or germanium. The first cap layer having a first thickness. The integrated circuit including a second semiconductor device having a second active region underlying a second electrode stack. The second active region includes a second layer including at least one of the group consisting of germanium and carbon and a second cap layer overlying the second layer. The second cap layer including silicon and substantially no carbon or germanium. The second cap layer having a second thickness. The first semiconductor device and the second semiconductor device have a same conductivity type, and wherein the first thickness and the second thickness are different.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit, comprising:
    a first semiconductor device having a first active region, the first active region underlying a first electrode stack, wherein the first active region comprises:
        a first layer comprising at least one selected from the group consisting of germanium and carbon; and
        a first cap layer overlying the first layer, the first cap layer comprising silicon and substantially no carbon or germanium, and the first cap layer having a first thickness;
    a second semiconductor device having a second active region, the second active region underlying a second electrode stack, wherein the second active region comprises:
        a second layer comprising at least one selected from the group consisting of germanium and carbon; and
        a second cap layer overlying the second layer, the second cap layer comprising silicon and substantially no carbon or germanium, and the second cap layer having a second thickness;
    a third semiconductor device having a third active region, the third active region underlying a third electrode stack, wherein the third active region comprises:
        a third layer comprising at least one selected from the group consisting of germanium and carbon; and
        a third cap layer overlying the third layer, the third cap layer comprising silicon and substantially no carbon or germanium, and the third cap layer having a third thickness;
    wherein the first semiconductor device, the second semiconductor device, and the third semiconductor device have a same conductivity type, and wherein the first thickness and the second thickness are different;
    wherein the first electrode stack comprises a first electrode dielectric, the second electrode stack comprises a second electrode dielectric, and the third electrode stack comprises a third electrode dielectric, wherein a thickness of the first electrode dielectric is less than a thickness of the second electrode dielectric and the thickness of the second electrode dielectric is less than a thickness of the third electrode dielectric.

2. The integrated circuit as in claim 1, wherein the first semiconductor device comprises a first p-channel transistor, and wherein the second semiconductor device comprises a second p-channel transistor.

3. The integrated circuit as in claim 1, wherein the first electrode dielectric including a first high-k dielectric layer overlying the first cap layer, the second electrode dielectric including an oxide layer overlying the second cap layer, and wherein the second electrode dielectric comprises a second high-k dielectric layer overlying the oxide layer.

4. The integrated circuit as in claim 3, wherein the first semiconductor device comprises a first p-channel transistor, and wherein the second semiconductor device comprises a second p-channel transistor.

5. The integrated circuit as in claim 3, wherein the first semiconductor device comprises a first n-channel transistor, and wherein the second semiconductor device comprises a second n-channel transistor.

6. The integrated circuit as in claim 3, wherein the third electrode stack comprises a second oxide layer, the second oxide layer overlying the third cap layer, the second oxide layer is of a different thickness than the oxide layer.

7. The integrated circuit as in claim 6, wherein the third electrode stack comprises a third high-k dielectric layer overlying the second oxide layer.

8. An integrated circuit as in claim 1, wherein the first semiconductor device comprises a first n-channel transistor, and wherein the second semiconductor device comprises a second n-channel transistor.

9. An integrated circuit, comprising:
    a first semiconductor device having a first active region, the first active region underlying a first electrode stack, wherein the first active region comprises:
        a first layer comprising at least one selected from the group consisting of germanium and carbon; and
        a first cap layer overlying the first layer, the first cap layer comprising silicon and substantially no carbon or germanium, and the first cap layer having a first thickness;
    a second semiconductor device having a second active region, the second active region underlying a second electrode stack, wherein the second active region comprises:
        a second layer comprising at least one selected from the group consisting of germanium and carbon; and
        a second cap layer overlying the second layer, the second cap layer comprising silicon and substantially no carbon or germanium, and the second cap layer having a second thickness;
    wherein the first semiconductor device and the second semiconductor device have a same conductivity type, and wherein the first thickness and the second thickness are different;
    wherein the first electrode stack comprises a first electrode dielectric, the first electrode dielectric including a first high-k dielectric layer overlying the first cap layer, wherein the second electrode stack comprises a second electrode dielectric, the second electrode dielectric including an oxide layer overlying the second cap layer, and wherein the second electrode dielectric comprises a second high-k dielectric layer overlying the oxide layer;

a third semiconductor device having a third active region, the third active region underlying a third electrode stack, wherein the third active region comprises:
  a third layer comprising at least one selected from the group consisting of germanium and carbon; and
  a third cap layer overlying the third layer, the third cap layer comprising silicon and substantially no carbon or germanium, and the third cap layer having a third thickness,
wherein the third electrode stack comprises a third high-k dielectric layer and a second oxide layer, the third high-k dielectric layer and the second oxide layer overlying the third cap layer, the second oxide layer is of a different thickness than the oxide layer;
wherein a thickness of the first electrode dielectric is less than a thickness of the second electrode dielectric.

10. The integrated circuit as in claim 9, wherein the first semiconductor device comprises a first p-channel transistor, and wherein the second semiconductor device comprises a second p-channel transistor.

11. The integrated circuit as in claim 10, wherein the third semiconductor device comprises a third p-channel transistor.

12. The integrated circuit as in claim 9, wherein the first semiconductor device comprises a first n-channel transistor, and wherein the second semiconductor device comprises a second n-channel transistor.

13. The integrated circuit as in claim 12, wherein the third semiconductor device comprises a third n-channel transistor.

14. The integrated circuit as in claim 9, wherein the third electrode stack comprises a third electrode dielectric, the thickness of the second electrode dielectric is less than a thickness of the third electrode dielectric.

15. An integrated circuit, comprising:
a first semiconductor device having a first active region, the first active region underlying a first electrode stack, wherein the first active region comprises:
  a first layer comprising at least one selected from the group consisting of germanium and carbon; and
  a first cap layer overlying the first layer, the first cap layer comprising silicon and substantially no carbon or germanium, and the first cap layer having a first thickness;
a second semiconductor device having a second active region, the second active region underlying a second electrode stack, wherein the second active region comprises:
  a second layer comprising at least one selected from of the group consisting of germanium and carbon; and
  a second cap layer overlying the second layer, the second cap layer comprising silicon and substantially no carbon or germanium, and the second cap layer having a second thickness;
wherein the first semiconductor device and the second semiconductor device have a same conductivity type, and wherein the first thickness and the second thickness are different;
wherein the first electrode stack comprises a first electrode dielectric, the first electrode dielectric including a first high-k dielectric layer overlying the first cap layer, wherein the second electrode stack comprises a second electrode dielectric, the second electrode dielectric including an oxide layer overlying the second cap layer, and wherein the second electrode dielectric comprises a second high-k dielectric layer overlying the oxide layer;
a third semiconductor device having a third active region, the third active region underlying a third electrode stack, wherein the third active region comprises:
  a third layer comprising at least one selected from the group consisting of germanium and carbon; and
  a third cap layer overlying the third layer, the third cap layer comprising silicon and substantially no carbon or germanium, and the third cap layer having a third thickness,
wherein the third electrode stack comprises a third high-k dielectric layer and a second oxide layer, the third high-k dielectric layer and a second oxide layer overlying the third cap layer, the second oxide layer is of a different thickness than the oxide layer.

16. The integrated circuit as in claim 15, wherein the first semiconductor device comprises a first p-channel transistor, and wherein the second semiconductor device comprises a second p-channel transistor.

17. The integrated circuit as in claim 16, wherein the third semiconductor device comprises a third p-channel transistor.

18. The integrated circuit as in claim 15, wherein the first semiconductor device comprises a first n-channel transistor, and wherein the second semiconductor device comprises a second n-channel transistor.

19. The integrated circuit as in claim 18, wherein the third semiconductor device comprises a third n-channel transistor.

* * * * *